US010623230B2

(12) United States Patent
Ding et al.

(10) Patent No.: US 10,623,230 B2
(45) Date of Patent: Apr. 14, 2020

(54) TRANS-LAYER ROBUST HEADER-COMPRESSION TECHNIQUE

(71) Applicant: The Regents of the University of California, Oakland, CA (US)

(72) Inventors: Zhi Ding, Davis, CA (US); Wenhao Wu, Davis, CA (US)

(73) Assignee: The Regents of the University of California, Oakland, CA (US)

(*) Notice: Subject to any disclaimer, the term of this patent is extended or adjusted under 35 U.S.C. 154(b) by 161 days.

(21) Appl. No.: 15/650,515

(22) Filed: Jul. 14, 2017

(65) Prior Publication Data

US 2018/0019908 A1 Jan. 18, 2018

Related U.S. Application Data

(60) Provisional application No. 62/363,755, filed on Jul. 18, 2016.

(51) Int. Cl.
*H04L 29/06* (2006.01)
*H04W 28/06* (2009.01)

(52) U.S. Cl.
CPC .... *H04L 29/0604* (2013.01); *H04L 29/06027* (2013.01); *H04L 69/04* (2013.01); *H04L 69/22* (2013.01); *H04W 28/06* (2013.01)

(58) Field of Classification Search
CPC ........... H04L 29/0604; H04L 29/06027; H04L 69/22; H04L 69/04; H04W 28/06
See application file for complete search history.

(56) References Cited

U.S. PATENT DOCUMENTS

| 9,924,000 | B2* | 3/2018 | Bertz | H04L 69/22 |
| 10,110,360 | B2* | 10/2018 | Bressanelli | H04L 1/1685 |
| 2007/0195764 | A1* | 8/2007 | Liu | H04W 28/24 370/389 |
| 2008/0080559 | A1* | 4/2008 | Singh | H04W 28/04 370/477 |
| 2012/0057546 | A1* | 3/2012 | Wang | H04L 1/1835 370/329 |

(Continued)

*Primary Examiner* — Andrew Lai
*Assistant Examiner* — M Mostazir Rahman
(74) *Attorney, Agent, or Firm* — Park, Vaughan, Fleming & Dowler LLP

(57) ABSTRACT

The disclosed embodiments relate to a system that compresses and transmits packets. During operation, the system obtains packets-to-be-compressed at a compressor located at a transmitter that transmits packets through a channel over a network link to a decompressor located at a receiver. The system also obtains cross-layer information regarding the network link from lower-layer network entities in the transmitter. Next, the system uses the cross-layer information to generate estimations for a state of the channel and a state of the decompressor. The system then determines a compression level for the packets-to-be-compressed based on a compression policy and the estimations for the state of the channel and the state of the decompressor. The system subsequently generates packets-to-be-transmitted by compressing headers of the packets-to-be-compressed, wherein the headers are compressed at different levels based on the determined compression level. Finally, the system transmits the packets-to-be-transmitted across a network to the receiver.

36 Claims, 7 Drawing Sheets

(56) References Cited

U.S. PATENT DOCUMENTS

| | | | |
|---|---|---|---|
| 2012/0189023 A1* | 7/2012 | Huang | H04L 1/0006 370/477 |
| 2012/0236862 A1* | 9/2012 | Furuta | H04L 69/04 370/392 |
| 2013/0083702 A1* | 4/2013 | Barany | H04W 28/06 370/261 |
| 2014/0334371 A1* | 11/2014 | Kim | H04W 52/0206 370/311 |
| 2015/0382243 A1* | 12/2015 | Liu | H04W 28/24 370/329 |
| 2016/0241685 A1* | 8/2016 | Shah | H04L 69/04 |

* cited by examiner

TRANS-LAYER ROBUST HEADER-COMPRESSION TECHNIQUE

CROSS-REFERENCE TO RELATED APPLICATION

This application claims the benefit of U.S. Provisional Patent Application Ser. No. 62/363,755, entitled "Trans-Layer Robust Header Compression (ROHC) Compressor Design," by inventors Zhi Ding and Wenhao Wu, filed on 18 Jul. 2016, the contents of which are incorporated by reference herein.

GOVERNMENT LICENSE RIGHTS

This invention was made with U.S. government support under National Science Foundation Grant Nos. CNS-1443870, ECCS-1307820 and CCF-1321143. The U.S. government has certain rights in the invention.

BACKGROUND

Field

The disclosed embodiments generally relate to techniques for improving the performance of wireless communication networks and related technologies. More specifically, the disclosed embodiments relate to a RObust Header Compression (ROHC) technique, which uses trans-layer information to improve the performance of a packet-header-compression operation within the wireless communication systems.

Related Art

The tidal wave of smartphones and high speed networks has propelled and energized numerous IP based packet services over cellular wireless networks. The fierce competition for limited resources by the rapidly growing scope of services and user population makes it imperative for network operators to improve the bandwidth efficiency not only through radio resource management at PHY/MAC layers, but also by exploiting the redundancy in protocol packets. Header compression is one such an important but less known technology that has been widely adopted in many modern communication links. (For example, see Evolved Universal Terrestrial Radio Access (E-UTRA); Packet Data Convergence Protocol (PDCP) specification, 3GPP Technical Specification TS 36.323 (v13.2.1), 2016.)

Header compression has considerable potential to improve networking performance. Firstly, packet payloads are often as long as, or sometimes even shorter than, the accompanied packet headers for many network services and applications, such as Voice over Internet Protocol (VoIP), interactive games, and media streaming. Secondly, packet headers from a packet stream have a lot of redundancy and are mostly compressible, as many fields in the headers remain unchanged or change in a predictable manner in a traffic flow over a connected link.

RObust Header Compression (ROHC) has been standardized by IETF to address the header compression in wireless links, characterized by high packet error rate (PER) and long round-trip time (RTT) and thus conventional header compression techniques designed for wireline links are not well suited. Under the ROHC technique, the transmitting compressor relies on the context of successive packet headers in a single stream (or radio bearer) to remove redundancies. The receiving decompressor also relies on the context for recovering the full packet headers upon reception of the compressed headers. The importance of header context at the decompressor means that some decompression failures, usually caused by successive packet errors at lower layers, may have serious consequences. When the decompressor loses its context after failing to decompress several packet headers, subsequent packets could also suffer from decompression failures even if lower layer receptions are error free. Consequently, it is critical to investigate the design trade-off between header compression efficiency and robustness against channel errors or packet losses.

Although the boiler-plate ROHC has found its application in a wide range of wireless packet networks, its analysis and optimization have only received moderate research attention. Most studies present simulation results on the performance of ROHC under realistic but very specific system settings, yet there exist very few attempts to comprehensively analyze ROHC performances, much less to optimize ROCH or key ROHC design parameters. It is also noted that much of this research has focused on "unidirectional-mode (U-mode) ROHC" in which there is no ROHC feedback since all ROHC sessions must begin from this mode and later on transition to bi-directional mode if so designed where the presence of a feedback channel appears to simplify the design of control logic in the ROHC compressor. Despite this research, many questions remain unanswered within the existing ROHC frameworks. First, it remains unclear how to optimally select some key parameters of a U-mode ROHC compressor, e.g. a set of timeout limits. Second, even though ROHC was developed for wireless packet-switch links, existing ROHC designs do not make full use of the protocol infrastructure of wireless communication systems, even though there are various signaling that can be collected from the PHY/MAC layers to aid the ROHC compressor to adjust the compression level. Without a trans-layer design for the ROHC compressor, it remains questionable whether the full potential of ROHC has been fully realized under the existing "stand-alone" design philosophy.

Hence, what is needed is a better technique for performing U-mode ROHC in wireless links, without the above-described uncertainties associated with existing techniques.

SUMMARY

The disclosed embodiments relate to the design of a system that compresses and transmits packets. During operation, the system obtains packets with headers-to-be-compressed at a compressor located at a transmitter that transmits packets through a channel over a network link to a decompressor located at a receiver. The system also obtains trans-layer information regarding the network link from lower-layer entities in the transmitter. Next, the system uses the trans-layer information to generate estimations for a state of the channel and a state of the decompressor. The system then determines a compression level for the header-to-be-compressed based on a compression policy and the estimations for the state of the channel and the state of the decompressor. The system subsequently generates the packets-to-be-transmitted by compressing its header, based on the determined compression level. Finally, the system transmits the packet-to-be-transmitted across a network to the receiver.

In some embodiments, determining the compression level involves using a dynamic process to select the compression level.

In some embodiments, determining the compression level involves using a belief update process on the system's state.

In some embodiments, determining the compression level involves using a partially observable Markov decision process (POMDP) to select an optimal compression level.

In some embodiments, determining the compression level involves determining timer values for state transitions of the compressor based on information obtained from the lower-layer network entities.

In some embodiments, compressing the headers of the packets-to-be-compressed includes using a window-based least significant bit (W-LSB) technique to compress the headers.

In some embodiments, generating the estimations for the state of the channel and the state of the decompressor involves using a Markov model.

In some embodiments, the different levels of header compression include: no header compression; partial header compression; and full header compression.

In some embodiments, the trans-layer information comprises one or more of the following: a state-transition probability of the channel; packet error rates under different channel states; a channel state estimation; an error probability for the channel state estimation; a transmission-status estimation; and an error probability for the transmission-status estimation.

In some embodiments, the trans-layer information is derived from one or more of the following: a physical-layer channel model; modulation and coding schemes; Automatic Repeat Request (ARQ) feedback; Hybrid ARQ (HARQ) feedback; and packet-segmentation and concatenation information.

In some embodiments, the lower-layer network entities comprise MAC/PHY layer entities in the transmitter.

In some embodiments, at least part of the network link is wireless.

DETAILED DESCRIPTION

Figure 1:
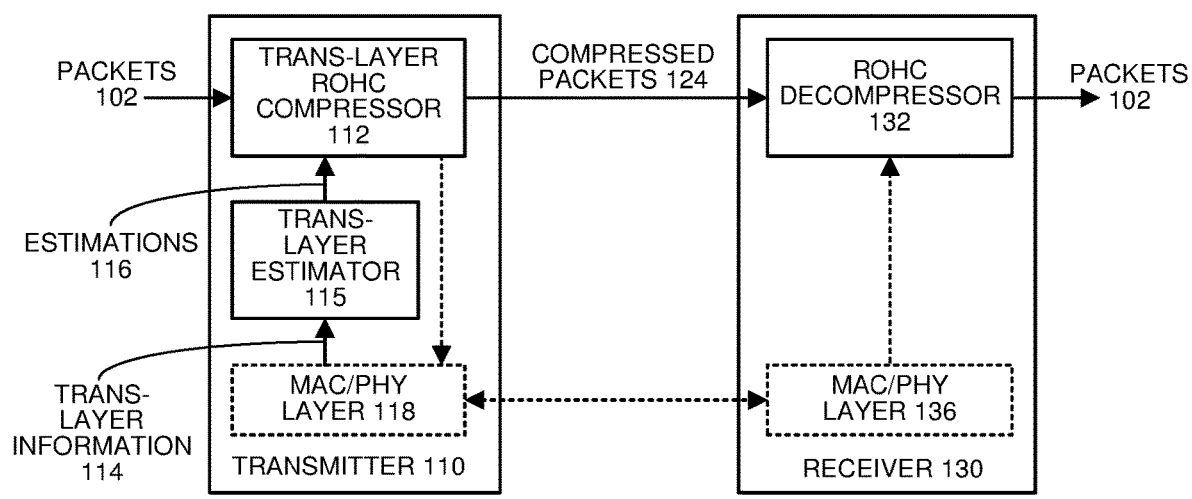
FIG. 1 presents a diagram of a trans-layer ROHC system in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), flash drives and other portable drives, or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

In packet-switched radio links, RObust Header Compression (ROHC) has become an integral part of many modern wireless communication systems. Embodiments of the present invention aim to improve the performance in terms of payload efficiency for U-mode ROHC system against poor wireless channel conditions. We first consider parameter optimization in existing ROHC systems, for which we propose a Markov ROHC compressor model suitable for realistic U-mode compressors. We present both steady-state analysis and analysis of the ROHC transient behavior. For generality, we propose a trans-layer ROHC compressor design by exploiting lower layer status information to adaptively adjust the compression level without dedicated feedbacks. Considering practical delay and inaccuracy when acquiring lower layer information, we present a novel formulation of the ROHC control as a partially observable Markov decision process (POMDP). Our results demonstrate the effectiveness of our Markov ROHC compressor model in characterizing both stationary and transient behavior, as well as the significant advantage of the proposed trans-layer ROHC design approaches.

The disclosed embodiments present an analytical U-mode ROHC compressor based on a Markov model which can be easily associated with practical ROHC compressors through a few key parameters. This U-mode compressor is examined under a finite-state Markov channel model more general than the Gilbert-Elliot model. We optimize the parameters of the compressor model for determining the time-out to maximize the stationary efficiency of the header recovery. The slow-start mechanism is also incorporated to characterize the transient ROHC behavior. These results lead to an integrated Markov model for the entire ROHC system consisting of the compressor, the channel, and the decompressor. Based on this model, we propose a trans-layer ROHC compressor design to utilize lower layer information to achieve high success rate without ROHC feedback. Unlike with the prior art, our practical consideration takes into account imperfect and delayed estimation on the transmission status and channel states, which leads to a partially observable Markov decision process (POMDP). Our results demonstrate that how the performance of ROHC system is impacted by the design parameters of the Markov model for optimization, as well as the potential advantage of the trans-layer design methodology.

Overview

The disclosed embodiments of a packet-compression system adaptively adjust how much each packet header should be compressed so that compression efficiency is maximized, while the receiver is less likely to enter an "out-of-synchronization state," where it cannot decompress the headers. To do so, a proposed ROHC compressor obtains a potentially inexact and delayed estimations including at least those of the channel state, and whether previous transmissions were successful or not using trans-layer information available from the RLC/MAC/PHY layer entities in the transmitter. Upon receiving these estimations and packets with full headers as inputs, the proposed ROHC compressor updates its belief regarding the system's state, and then determines an optimal compression level based on the current belief on the updated belief, for example, based on a partially observable Markov decision process (POMDP) with a pre-computed policy set. As a result, the compressor outputs packets with headers compressed to different levels. This new compressor design ensures efficient use of the lossy channel, and can be adapted to use additional cross-layer information as inputs to the compressor to achieve even better performance, such as occasional feedback from the receiver and a priority indicator for each packet.

The disclosed embodiments also include a kind of conventional-style packet-compression system which adjust the header compression level based on a few timers, whose timeout parameters are optimized based only on the static trans-layer information acquired from lower layers. This new compressor design also makes efficient use of the lossy channel, but with less implementation complexity.

In contrast to existing explicit bi-directional header-compression schemes, the disclosed embodiments do not rely on a dedicated feedback channel, which can cause additional delay and overhead. Instead, it achieves high transmission efficiency by making use of trans-layer information, which is available from the lower-layer network entities in the transmitter. Moreover, the proposed compressor design requires no changes to the receiver, and only a trans-layer module needs to be added to the transmitter, which leads to relatively simple implementation.

Compressor Design

FIG. 1 presents a diagram of an exemplary trans-layer ROHC system in accordance with the disclosed embodiments. This system includes a transmitter 110 and a receiver 130, which communicate with each other through a channel, such as a wireless link (not shown). Transmitter 110 includes a trans-layer ROHC compressor 112, which communicates with a corresponding ROHC decompressor 132, which is part of receiver 130. Note that both trans-layer ROHC compressor 112 and ROHC decompressor 132 can be defined as layer 2 in the seven-layer OSI model of computer networking. Moreover, trans-layer ROHC compressor 112 operates through lower-level networking mechanisms in MAC/PHY layer 118, which operate in layers 1 and 2 in the Open Systems Interconnection (OSI) networking model. Similarly, ROHC decompressor 132 operates through lower-level networking mechanisms in MAC/PHY layer 136, which similarly operate in layers 1 and 2 of the OSI model. During operation, trans-layer ROHC compressor 112 receives packets-to-be transmitted 102 and generates packets with compressed headers 124, which are communicated to ROHC decompressor 132. ROHC decompressor 132 decompresses the compressed packets 124 to restore packets 102. During this compression process, transmitter 110 feeds trans-layer information 114 obtained by MAC/PHY layer 118 through a trans-layer estimator 115 to produce estimations 116 about the state of the channel and the state of ROHC decompressor 132. These estimations 116 are used by trans-layer ROHC compressor 112 to perform the compression operation as is described in more detail below.

Figure 2:
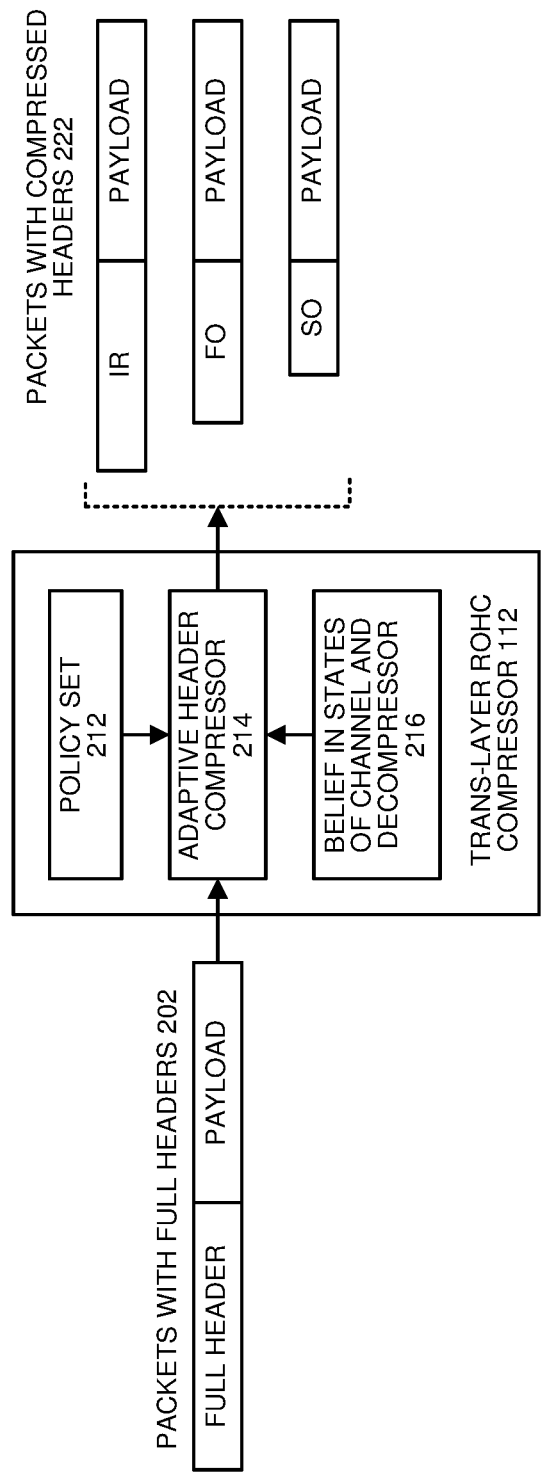
FIG. 2 illustrates a POMDP ROHC compressor in accordance with the disclosed embodiments.

FIG. 2 illustrates additional details about trans-layer ROHC compressor 112 in accordance with the disclosed embodiments. During operation, adaptive header compressor 214 within trans-layer ROHC compressor 112 compresses a set of packets with full headers 202 to produce a set of packets with compressed headers 222, wherein the compressed headers can have variable sizes (IR, FO and SO) as is discussed in more detail below. During this compression process, adaptive header compressor 214 uses a belief in the states of the channel and decompressor 216 (see estimations 116 in FIG. 1) and a policy set 212, which defines compression policies, to perform the compression operation. This compression process and the associated ROHC compressor are described in more detail below.

System Model

The following notational conventions are used throughout this specification. Scalars, vectors, matrices and sets are represented with regular font, bold-face lower-case, bold-face upper-case, and calligraphic letters, respectively. A matrix transpose operation is denoted with $(\cdot)^T$. The Cartesian product of sets $\mathcal{A}$ and $\mathcal{B}$ is denoted as $\mathcal{A} \times \mathcal{B}$. All the Markov matrices are written as left stochastic matrices in which each column sums to 1, and all the probability vectors are column vectors. As a naming rule throughout this manuscript, the subscript "C", "H", "D" and "T" stands for "compressor", "channel", "decompressor" and "transmission", respectively. And in the Markov model, state variables with and without prime symbol (e.g. s' and s) represent the next state and the current state, respectively. The time index, i.e. the sequence number of the n-th packet/time-slot, is denoted as "[n]". We use C language style notation for indexing variables which starts from 0.

The ROHC System

In a typical ROHC mechanism, each packet stream must rely on its own compressor and decompressor. We focus on a simple model in which a U-mode ROHC compressor transmits a packet stream with compressed headers, whereas a corresponding remote decompressor receives and recovers the packet header (along with the full packet recovery by the receiver).

A U-mode compressor can be modeled as a finite-state machine (FSM) with three states, each represented with the type of packets transmitted at this state. The fields of a packet header can be roughly categorized as being static, which does not change throughout the packet session (e.g. IP address), and dynamic, which changes regularly and mostly in specific patterns and thus can be compressed, for example, with a non-constant serial number (e.g. IP ID). The compressor always starts in the Initialization-and-Refresh (IR) state by transmitting IR packets, whose headers are not compressed, to establish context synchronization. First-Order (FO) packets are usually partially compressed, which contain differential information about the dynamic fields and, rarely a few static fields to efficiently communicate irregularities in the packet stream. Finally, the headers of the Second-Order (SO) packets are fully compressed. The compressor transits upward to higher-order states (FO and SO) by sending several packets of the same type within each lower state (i.e. IR and FO) to gain enough confidence. It also needs to transition downward based on timeouts and the need for updates to prevent the context at the compressor and the decompressor from becoming out-of-synchronization (OoS) due to loss of packets. Because the disclosed embodiments focus on the compressor optimization against a lossy channel, it is assumed that the input to the compressor is always regular/compressible, such that downward transition to the FO state is only needed to recover context synchronization and a downward transition to the IR state is not necessary.

Correspondingly, the ROHC decompressor is also modeled as a FSM with three states. In the Non-Context (NC) state, the decompressor requires initialization and can only decode IR packets. Upon successful reception of at least one IR packet, thereby establishing context for both the static and dynamic fields, the decompressor transitions upward to the Full-Context (FC) state, in which all three types of (IR, FO, SO) packets can be decompressed. In case of repeated decompression failures, the decompressor can also transition back down to an intermediate Static-Context (SC) state, where one FO or IR packet would suffice to re-establish context synchronization to move the decompressor upwards again to FC state. It is assumed that the packet source is always compressible, and a decompression failure is solely caused by transmission errors. Consequently, a single FO packet transmitted successfully is sufficient for an upward transition from SC to FC, and for the original "k-out-of-n" downward transition rule, the system sets k=n=1. Despite being derived from our regular packet source assumption, both conditions are highly realistic (See Sec. 4.3.2 and 5.3.2.2.3 of C. Bormann, C. Burmeister, M. Degermark, H. Fukushima, H. Hannu, L.-E. Jonsson, R. Hakenberg, T. Koren, K. Le, Z. Liu, A. Martensson, A. Miyazaki, K. Svanbro, T. Wiebke, T. Yoshimura, and H. Zheng, "RObust Header Compression (ROHC): Framework and four profiles: RTP, UDP, ESP, and uncompressed, RFC 3095", March 2001.)

During the header-compression process, the system uses a variation of the window-based least significant bits (W-LSB) technique, wherein the W-LSB compressor maintains a reference window based on which the compressor decides to transmit k LSBs. Upon receiving the compressed header verified by CRC, the decompressor is able to figure out the complete header by identifying the only possible value in the interpretation interval, as long as its reference value resides in the compressor's window. The system characterizes the robustness of our ROHC system based on W-LSB encoding with a single parameter W, namely the maximum number of packets that can be lost consecutively without losing context synchronization. (Additional details about the selection of the W-LSB parameters are presented in S. Kalyanasundaram, V. Ramachandran, and L. M. Collins, "Performance analysis and optimization of the window-based least significant bits encoding technique of rohc," in Global Telecommunications Conference, 2007. GLOBECOM '07. IEEE, November 2007, pp. 4681-4686.)

A key header compression technique is the Window-based Least Significant Bits (WLSB) algorithm which is adopted on many header fields. As a modification of the Least Significant Bits algorithm, the WLSB compressor maintains a reference window based on which the compressor decides to transmit k LSBs. Upon receiving the compressed header verified by CRC, the decompressor is able to figure out the complete header by identifying the only possible value in the interpretation interval, as long as the its reference value resides in the compressor's window. In this work, we characterize the robustness of our ROHC system based on WLSB encoding with a single parameter W, i.e., the maximum number of packets that can be lost consecutively without losing context synchronization. We note that the selection of the WLSB parameters is out of the scope of this embodiment. Combined with the aforementioned FSM-model, our decompressor model is similar to model 2 described in R. Hermenier, F. Rossetto, and M. Berioli, "On the behavior of Robust Header Compression U-mode in channels with memory," IEEE Trans. Wireless Commun., vol. 12, no. 8, pp. 3722-3732, August 2013.

Figure 3:
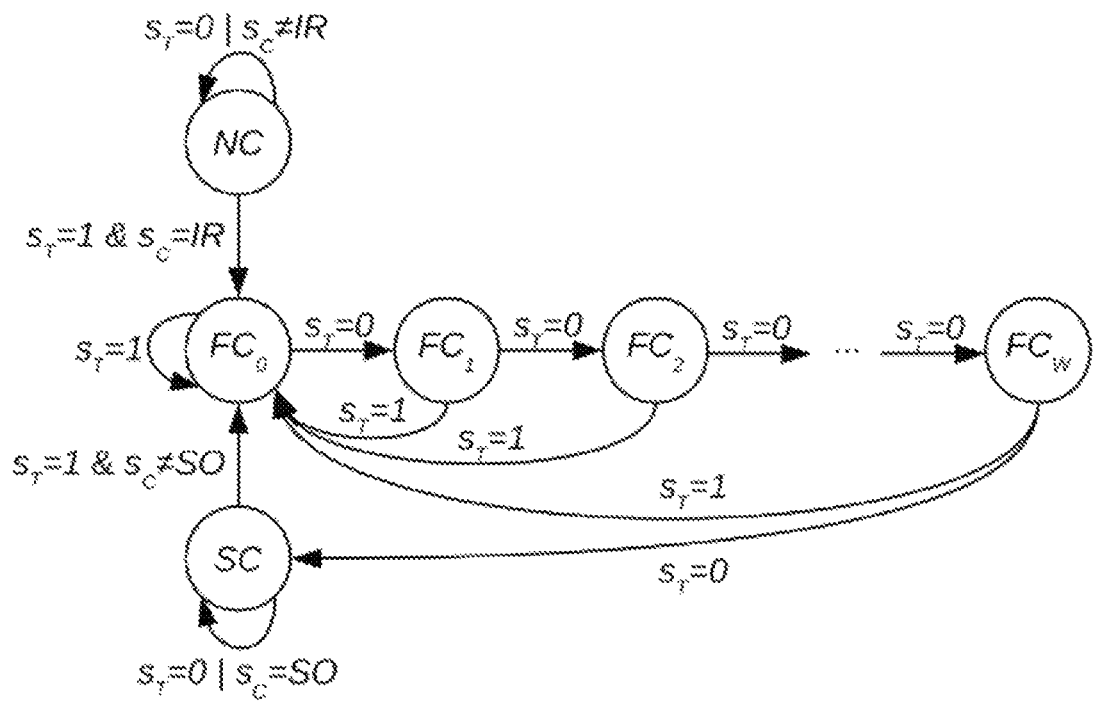
FIG. 3 illustrates a finite-state machine (FSM) model for an ROHC decompressor in accordance with the disclosed embodiments.

In summary, the work flow of our ROHC model during a packet session is demonstrated with the state transition diagram of the decompressor dependent on the transmission status and the header type from the compressor as shown in FIG. 3. The state of the decompressor is represented by $s_D = FC_0, \ldots, FC_W, SC, NC$, where $FC_W$ denotes the decompressor still maintaining full context but a consecutive of w packets have been lost. Also, $s_T=1$ and $s_T=0$ represent successful/failed transmission of a packet and $s_C$ denotes the header type. Initially, the decompressor always starts from the NC state. Upon the successful transmission of an IR packet with a full header, both the static and the dynamic context have been established and thus the decompressor enters the $FC_0$ state and is able to decompress all three types of packets if transmitted successfully. As long as the decompressor maintains full context ($s_D=FC_0, \ldots, FC_W$), the successful transmission of any type of packet will lead the decompressor back to $FC_0$ state. If a consecutive of W+1 transmission has failed, the dynamic context will be lost and the ecompressor enters the SC state where it is only able to decompress IR or FO packet. Upon the successful transmission of either of these two types of packets, the decompressor will transition back to $FC_0$ state. For notational convenience, we denote $s_D=w$, $w=0, \ldots, W$ as the decompressor being in $FC_w$ state, while $s_D=W+1$ and $s_D=W+2$ as SC and NC state, respectively. In the following, we also denote $s_C=0, 1, 2$ as IR, FO and SO headers, respectively.

The Channel Model

Consider a general finite-state Markov channel with K states, whose parameters can be estimated from wireless traces with, for example, a modified Baum-Welch algorithm. The transition matrices of this channel are denoted by a K-by-K matrix $P_H$, and the probability of successful transmission of IR, FO and SO packets is denoted by $\rho_{s_C}$, $s_C=0$, 1, 2, respectively.

List of Assumptions

To enable a simple analysis, we make the following practical assumptions on our system model:

Assumption A1—

The three types of headers and the payload capsules in a packet have fixed lengths, denoted as $H_0$, $H_1$, $H_2$ and $L_P$, respectively, where $H_0>H_1>H_2$ would reflect the different compression levels of the IR, FO and SO headers. The total length of IR, FO and SO packets are denoted as $L_0$, $L_1$, $L_2$, respectively, where $L_i=H_i+L_P$, i=0, 1, 2.

Assumption A2—

Assume $\rho_0 \leq \rho_1 \leq \rho_2$, which represents the probability of successful packet transmissions for IR, FO and SO packets, respectively, where ≤ denotes an entry-wise less-than-or-equal-to relationship.

Assumption A3—

As shown in FIG. 3, as long as an IR packet is transmitted successfully once, the decompressor never goes back to the NC state.

Assumption A1 is made to facilitate a straightforward analysis. In reality, there are more than one type of FO (e.g., IR-DYN, UOR-2, etc.) and SO packets (e.g., UO-0, UP-1, etc.), and the payload length may also vary. Assumption A2 suggests that under the same channel condition, longer packets are more prone to packet loss. Assumption A3 is because the static fields of the headers remain unchanged throughout the entire life span of the packet stream.

Optimization of Conventional U-Mode ROHC Compressor

The state transitions for a conventional U-mode ROHC compressor are determined by several timer/counters, which leads to deterministic, periodic behavior and are easy to implement. However, in terms of performance analysis and optimization, this model is undesirable because it is difficult to derive a relationship between the average performance measurement and the parameters without a Monte-Carlo simulation. A rigorous Markov modeling of the ROHC system with the periodic compressor would result in a prohibitively large state space if the period is large.

To overcome this dilemma of the timer-based U-mode ROHC compressor, it is possible to approximately model the compressor as a Markov process that is much more amenable to theoretical analysis and optimization. The system identifies a few key characterizing variables which can be evaluated for both a conventional ROHC compressor and the Markov ROHC compressor, and derives a one-to-one mapping between the design parameters of the two models. Consequently, to analyze a timeout-based ROHC compressor, the system first maps it onto a Markov ROHC compressor. The system then carries out the analysis and optimization operations on the Markov ROHC compressor before mapping the results back to the timeout-based ROHC compressor.

Markov Chain Modeling of Practical Compressor

The Markov compressor has the same three states as the conventional ROHC compressor, characterized by a 3-by-3 transition matrix $P_C$, where $P_{C,ij}=\mathbb{P}$ (transition to state i from state j), where i, j=1, 2, 3 represents IR, FO and SO, respectively.

Figure 4:
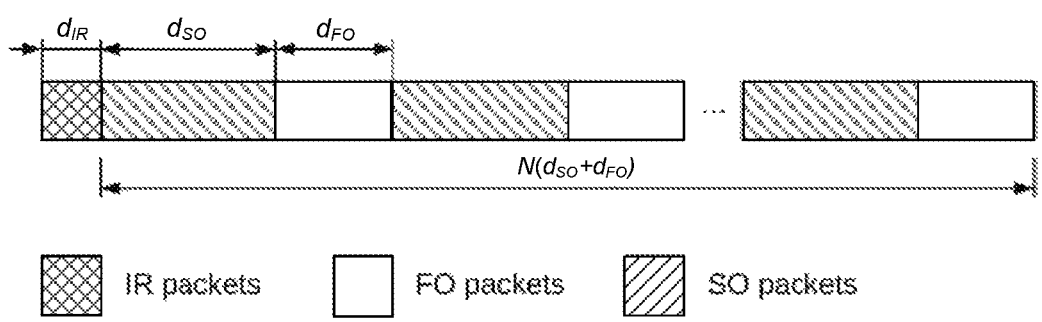
FIG. 4 presents a timing diagram for a U-mode compressor based on a timeout in accordance with the disclosed embodiments.
Figure 5:
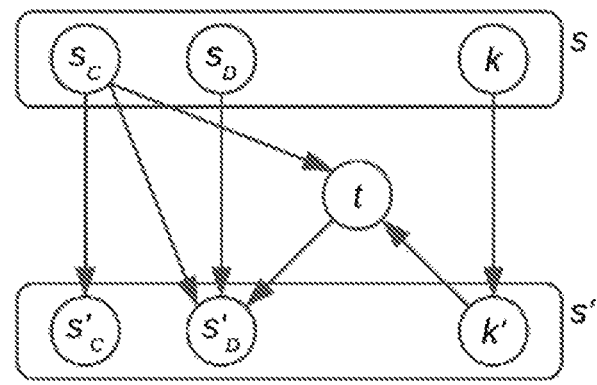
FIG. 5 illustrates a DBN representation of the ROHC system with a Markov compressor in accordance with the disclosed embodiments.

One possible approach to match the timer-based compressor and the timer-based compressor, for example, is introduced as follows. The stationary behavior of any U-mode compressor can be approximately characterized by 6 design parameters, namely $f_{s_C}$ and $d_{s_C}$, which represent the fraction and the average duration of consecutive transmission of IR, FO and SO packets, respectively, where $s_C=0$, 1, 2 denotes IR, FO and SO packets, respectively (FIG. 4). To facilitate a 1-to-1 mapping between the two sets of parameters, note that in practice it makes no sense for the compressor to transition from IR state to FO state, instead of directly transitioning to SO state. Consequently, let $P_{C,21}=0$. For the Markov compressor, $f=[f_0, f_1, f_2]^T$ denotes the steady-state distribution of $P_C$, whereas $d_0$, $d_1$, $d_2$ denote the mean durations of the three states, respectively. In summary, the two set of parameters can be mapped from one to the other by solving $$d_0 = \frac{1}{P_{C,31}},\ d_1 = \frac{1}{P_{C,12}+P_{C,32}}, \qquad (1)$$
$$d_2 = \frac{1}{P_{C,13}+P_{C,23}},\ P_c f = f.$$

The approximated Markov compressor is optimized instead of the timeout-based ROHC compressor, and then mapped back to that of the latter. The performance evaluation and optimization of the approximated Markov compressor is described in more detail below.

Performance Metrics and Optimization

Figure 6:
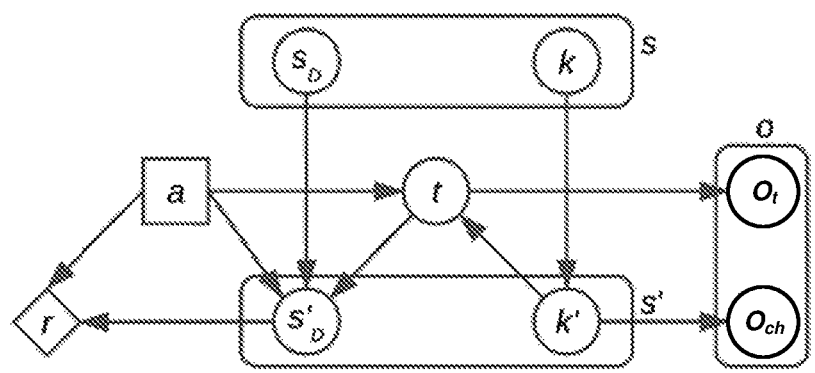
FIG. 6 illustrates a DBN representation of the POMDP model for a trans-layer ROHC design in accordance with the disclosed embodiments.

By modeling the U-mode ROHC compressor as a Markov process, the entire ROHC system consisting of the compressor, the channel and the decompressor can now be formulated as one integrated Markov process. To see this, denote the system state as a 3-tuple $s=(s_C, s_D, s_H) \in \mathcal{S}$, where $s_C \in \mathcal{S}_C=\{0, 1, 2\}$, $s_D \in \mathcal{S}_D=\{0, \ldots, W+2\}$ and $s_H \in \mathcal{S}_H=\{0, \ldots, K-1\}$ are the compressor's state (header type of the next packet), the decompressor's state and the channel's state (last realization), respectively. The ROHC system's state space $\mathcal{S}=\mathcal{S}_C \times \mathcal{S}_D \times \mathcal{S}_H$ has a cardinality of 3(W+3)K. As explained in the channel model, the transmission status $s_T$ depends on $s_C$ and $s_H'$. Based on the assumptions in this embodiment, the state transition-probability is illustrated as a dynamic Bayesian network (DBN) in FIG. 6, where circles represent random variables (RV), and arrows represent the conditional dependency which are defined by the channel model, the Markov compressor model, and the decompressor's state transition graph in FIG. 3.

The primary benefit in formulating such an integrated Markov model is that many performance metrics can be readily defined using its (marginal) stationary distribution. For instance, define compression transparency as the probability that the decompression is successful, conditioned on a successful transmission. Note that the compression transparency serves as an indicator of how well the ROHC avoids unnecessary packet loss caused by header compression. Against such packet losses, upper layers may have to retransmit, causing extra delays. Another possible performance metric is the compression rate, defined as the ratio between the size of a full header and the average size of a compressed header. The compression rate serves as an indicator of how much the ROHC remove the redundancy from the headers. The optimization scheme for the timer-based ROHC compressor proposed in this embodiment can be readily generalized to achieve different design objectives and constraints.

Now consider the compressor optimization problem to maximize the transmission efficiency, which directly measures the effective bandwidth usage of a package-switched link equipped with ROHC. Specifically, η is defined as the ratio between the expected number of decompressed payload bytes and that of the transmitted bytes (including both header and payload).

Because it is difficult, if not impossible, to derive a closed form for the stationary distribution of the ROHC system, the problem is solved numerically. At first glance, there are 5 variables in $P_C$ to optimize, which represents a very large search space. In the research related to this embodiment, it is shown that under certain conditions the Markov compressor model indeed favors transmitting only FO and SO packets after an initialization stage during which IR packets are transmitted to establish context synchronization. Therefore, the maximization of $\eta$ is reduced to an optimization problem with respect to only two variables, namely $P_{C,11}$ and $P_{C,22}$, instead of $P_C$ which has 5 independent variables in the search space. Later in this embodiment, it is explained how a protocol-dictated slow-start action can be integrated into our Markov ROHC compressor to ensure context synchronization by transmitting more IR packets during the initial phase of the ROHC session.

Consequently, consider a reduced Markov compressor with only two states $s_C=1, 2$. Correspondingly, the Markov transition matrix for the reduced state space $\mathcal{S}_R=\{s|s\in\mathcal{S}, s_C\neq 0\}$ can be defined as $$P_S = \begin{bmatrix} P_{C,11}T_1 & (1-P_{C,22})T_2 \\ (1-P_{C,11})T_1 & P_{C,22}T_2 \end{bmatrix} \quad (2)$$

where $$T_1 = \begin{bmatrix} A_1 & \cdots & A_1 & A_1 & 0 \\ B_1 & & 0 & 0 & 0 \\ 0 & \ddots & \vdots & \vdots & \vdots \\ \vdots & & B_1 & B_1 & 0 \\ 0 & \cdots & 0 & 0 & P_H \end{bmatrix} \quad (3a)$$

$$T_2 = \begin{bmatrix} A_2 & \cdots & A_2 & 0 & 0 \\ B_2 & & 0 & 0 & 0 \\ 0 & \ddots & \vdots & \vdots & \vdots \\ \vdots & & B_2 & C & 0 \\ 0 & \cdots & 0 & 0 & P_H \end{bmatrix} \quad (3b)$$

where $A_{s_C}=\mathrm{diag}(\rho_{s_C})P_H$ and $B_{s_C}=P_H-A_{s_C}$, $s_C=1, 2$. Note, however, that $P_S$ has two closed communication classes, i.e. $\mathcal{S}_1=\{s|s_D\neq W+2, s\in\mathcal{S}_R\}$ and $\mathcal{S}_2=\mathcal{S}_R\backslash\mathcal{S}_1$. Therefore, its stationary distribution is not uniquely defined. To tackle this issue, it is ensured by the slow-start operation, which is introduced next, that enough IR packets have been transmitted before the compressor enters the stationary distribution, such that the decompressor is not in the NC state. Consequently, the stationary distribution of the ROHC system can be uniquely defined with a non-zero value over $\mathcal{S}_1$.

In summary, the optimization of the Markov compressor is well-defined as $$\max_{P_{C,22},P_{C,33}} \eta, \; s.t. \; 0 \leq P_{C,22}, P_{C,33} \leq 1, \quad (4)$$

which can be easily solved with a general-purpose optimization tool or a basic 2-D grid search.

The Slow-Start Strategy

The maximization of efficiency $\eta$ in equation (4) is based on the steady-state analysis of the Markov model. However, in practice, when an ROHC session starts, the initial state of the system must have $s_C=0$ and $s_D=W+2$. As a result, when directly applying the optimized Markov compressor, there will only be a limited number of IR packets transmitted on average before the compressor transitions to other states and will not transmit IR packets again. Consequently, the decompressor has a good chance of never leaving the NC state. Thus, the ROHC system will not converge to the desired stationary distribution corresponding to the maximum $\eta$.

This scenario directly justifies the strategy of transmitting IR packets more frequently at the beginning of a ROHC session. One such strategy already adopted in practical ROHC compressor is called "slow-start," in which an uncompressed IR packet is transmitted with exponentially increasing intervals. Other approaches for the initialization stage include to transmit a number of IR packets consecutively at the beginning or the ROHC session.

A New Trans-Layer U-Mode ROHC Compressor Design

The previous description focused on optimizing the conventional U-mode ROHC compressor based on the statistical information regarding the ROHC channel. To further improve the efficiency and reliability of ROHC U-mode without requiring explicit and costly feedback channel as in O-mode and R-mode, the following description presents a new trans-layer framework for controlling ROHC compressor by leveraging useful information obtained from the lower layers to obtain partial information of the decompressor's state.

Exploiting Trans-Layer Information

At least two types of lower-layer information are available for ROHC control at the upper PDCP layer in the transmitter:

1) A status estimate of whether or not previous ROHC packets have been transmitted successfully. This estimate can benefit, for example, from the HARQ feedback. It is characterized by the false alarm probability $P_{FA}$ and the mis-detection probability $P_{MD}$ with respect to transmission failures.

2) An estimation of the previous ROHC channel state. This information can be acquired by analyzing the control signals from the lower-layers (e.g., CQI from PHY, link-adaptation, etc.). The channel estimator's performance is characterized by matrix $E_H$, whose entry $\{E_H\}_{ij}$ is the probability for channel estimation of i when the actual channel state is j.

Ideally, it is possible to get the packet-status estimation and channel-state estimation for the most recent ROHC packets. However, in practice, due to the transmission and processing delay of, for example, the HARQ and CQI feedbacks, the ROHC compressor at the transmitter's PDCP layer may only acquire lower layer information with d ROHC packet delay. We will address this problem by extending the state space after formulating a basic trans-layer ROHC compressor without observation delays.

A POMDP Formulation

For ROHC context synchronization, it is important for the compressor to process packet headers in accordance with the decompressor's state. However, the compressor does not have direct knowledge of the decompressor's state. The described POMDP formulation aims to allow the compressor, without a direct state feedback from the decompressor, to estimate the state of the decompressor based on partial observations from its lower-layer signaling.

The fundamental principle is that, based on the initial state of the decompressor, the transmission and channel state estimation, a belief on the ROHC system's state can be continuously updated, and an optimal decision can be made regarding the type of packet header to transmit next. This problem can be formulated into a partially observable Markov decision process (POMDP). First, consider the simple case of zero-delay estimation where d=0, represented as a DBN in FIG. 6. The trans-layer ROHC compressor is formulated into a POMDP defined by the following elements.

State of the system: Defined as the Cartesian product of the decompressor's state and the channel's state $\tilde{s}=(s_D, s_H) \in \tilde{\mathcal{S}} = \mathcal{S}_D \times \mathcal{S}_H$.

Action of the agent: The POMDP compressor decides the type of packets to transmit next, which is defined as $a \in \mathcal{A} = \mathcal{S}_C = \{0, 1, 2\}$.

Observation: Defined as the combination of packet status estimation and channel state estimation $o=(o_T, o_H) \in \Omega = \Omega_T \times \Omega_H$ where $o_T \in \Omega_T = \{0, 1\}$ represents the transmission status observation, and $o_H \in \Omega_H = \mathcal{S}_H = \{0, \ldots, K-1\}$ represents the channel state observation.

Probabilistic transition function $T(\tilde{s}, a, \tilde{s}') = p(\tilde{s}'|\tilde{s}, a)$: the probability of transition from $\tilde{s}$ to $\tilde{s}'$ given action a. This function is defined by the Markov channel model and the decompressor's state transition graph in FIG. 3.

Observation function $O(\tilde{s}', a, o) = p(o|\tilde{s}', a)$: the probability of observing o in state $\tilde{s}'$ after executing a. The channel state observation depends on the channel state, and the transmission status estimation depends on the actual transmission status, which in turn depends on the packet header type, the decompressor's state and the channel state.

Reward function $R(\tilde{s}, a, \tilde{s}')$: the immediate reward of transition from $\tilde{s}$ to $\tilde{s}'$ by executing a. Various modifications are readily apparent by using different reward function to achieve different objectives for the optimal ROHC control without departing from the design philosophy of this embodiment. For instance, in order to optimize η, the reward function is defined as the single-transmission efficiency, namely $$R(\tilde{s}, a, \tilde{s}') := \begin{cases} \frac{L_P}{L_a} & \text{if } s'_D = 0, \\ 0 & \text{otherwise.} \end{cases} \tag{5}$$

Let $q_m(\tilde{s})$ be the joint belief regarding the decompressor and the channel's state $\tilde{s}$ at time m. Denote the $|\tilde{\mathcal{S}}|$-by-1 vector $q_m$ whose entries are $q_m(\tilde{s})$, $\tilde{s} \in \tilde{\mathcal{S}}$ as the belief vector of the POMDP system at time m, which is updated by the observation o and the action a. The goal of our POMDP formulated from the ROHC design problem is to find an optimal policy π, which maps belief of the state at time m to an action, namely $a_m = \pi(q_m)$, to maximize the infinite-horizon discounted reward:

$$\max_\pi \Sigma_{n=0}^\infty \gamma^n \mathbb{E}[R(\tilde{s}_n, \pi(q_n), \tilde{s}_{n+1})] \tag{6}$$

with discount factor $0 \leq \gamma < 1$.

POMDP Under Observation Delay

For practical systems, it is necessary take into account the effect of the observation delay d. One classical approach is to augment the state space with the action history (See Bander, J. L., and C. C. White. "Markov decision processes with noise-corrupted and delayed state observations." Journal of the Operational Research Society 50.6 (1999): 660-668.) such that $\tilde{s}_d = (a_d, s_{D,d}, s_{H,d}) \in \tilde{\mathcal{S}}_d = \mathcal{A}^d \times \tilde{\mathcal{S}}$, where $a_d =$ $(a_1, \ldots, a_d)$ to incorporate $a_1$ as the action taken i ROHC packets ago. Note that $s_{D,d}$ and $s_{H,d}$ are, respectively, the decompressor's state and the channel's state going back d ROHC packets in time. As a result, the cardinality of the state space increases from $\dim(\tilde{\mathcal{S}}) = (W+3)K$ to $\dim(\tilde{\mathcal{S}}_d) = 3^d(W+3)K$. Furthermore, the observation obtained with delay is represented as $o_d = (o_{T,d}, o_{H,d}) \in \Omega$.

The sequence of operations of the POMDP framework is as follows: At each time slot m, the ROHC compressor keeps track of the belief $q_m(\tilde{s}_{U,d})$ on all the unobservable state variables $\tilde{s}_{U,d} = (s_{D,d}, s_{H,d}) \in \tilde{\mathcal{S}}$. It also maintains the exact value of the observable state variable, namely the action history $a_d$. The POMDP must decide the best action to take according to the solution of its policy by mapping $\{q_m(\tilde{s}_{U,d}) | \tilde{s}_{U,d} \in \tilde{\mathcal{S}}\}$ and $a_d$ to the action space $\mathcal{A}$. In other words, if we let $q_U = \{q_m(\tilde{s}_{U,d}) | \tilde{s}_{U,d} \in \tilde{\mathcal{S}}\}$ be an $|\mathcal{S}|$-dimensional vector containing its current beliefs, then the POMDP decision policy is simply $a = \hat{\pi}(q_U, a_d)$.

Taking the action $a = \hat{\pi}(q_U, a_d)$ at time m will trigger another state transition, leading to a new observation $o_d$ and $a_d'$, the compressor updates its belief over the unobserved states as:

$$q_{m+1}(\tilde{s}'_{U,d}) = p(o_d | a)^{-1} O(\tilde{s}'_{U,d}, a, o_d | a'_d) \tag{7a}$$
$$\sum_{\tilde{s}_{U,d} \in \tilde{s}} T(\tilde{s}_{U,d}, a, \tilde{s}'_{U,d} | a_d) q_m(\tilde{s}_{U,d})$$

$$p(o_d | a) = \sum_{\beta \in \tilde{s}} O(\beta, a, o_d | a'_d) \tag{7b}$$
$$\sum_{\tilde{s}_{U,d} \in \tilde{s}} T(\tilde{s}_{U,d}, a, \beta | a_d) q_m(\tilde{s}_{U,d})$$

where $$T(\tilde{s}_{U,d}, a, \tilde{s}'_{U,d} | a_d) = p(s_{H,d}' | s_{H,d}) p(s_{D,d}' | s_{D,d}, a_d, s_{H,d}') \tag{8a}$$

$$O(\tilde{s}'_{U,d}, a, o_d | a'_d) = O(\tilde{s}_d', a, o_d) \tag{8b}$$

while $a_d'$ are directly observed. From here, the POMDP enters the next stage of m+1. The POMDP framework is demonstrated in FIG. 7.

In spite of the fixed delay d considered so far, it is also possible to design trans-layer ROHC compressor based on the framework described in this embodiment without departing its main principle for varying and/or random observation delay.

Solving POMDP and Complexity Analysis

It is generally intractable to solve the POMDP problem exactly due to its prohibitive complexity. Nevertheless, there exist efficient approximated POMDP-solving techniques, such as Markov-decision-process-based heuristics and point-based value iteration methods (See M. T. Spaan, "Partially observable Markov decision processes," in Reinforcement Learning. Springer, 2012, pp. 387-414). The described system can adopt any of the previously developed technique to solve the POMDP problems on a general-purpose. Since the POMDP needs only to be solved once for given system settings, the proposed algorithm can be executed during the ROHC negotiation process or even offline followed by a policy look-up. Hence, algorithm of such complexity level is in fact practical.

The online complexity for this trans-layer ROHC compressor to determine the header type for each packet transmitted originates from two operations. First, the complexity to perform the belief update is $O(|\mathcal{S}|^2)=O((K(W+3))^2)$ for both the zero-delay and non-zero-delay POMDP. Second, the complexity to select the optimal action involves evaluating the numerical solution of the policy function $\hat{\pi}(q_U, a_d)$. The optimal value function of the finite-horizon POMDP is piecewise linear and convex (PWLC), while the optimal value function of the discrete infinite-horizon POMDP can be approximated asymptotically by a PWLC function. Specifically, most POMDP algorithms construct their policy function based on a set of mappings, each associated with a possible value of the observable variable $a_d \in \mathcal{A}^d$. Among them, the mapping associated with the observable variable $a_d$ is denoted as $\mathcal{V}_{a_d} \to \mathcal{A} : \pi_{a_d}(v)$, which maps a $|\mathcal{S}|$-dimensional vector $v \in \mathcal{V}_{a_d}$ to an action $a \in \mathcal{A}$ and $\mathcal{V}_{a_d}$ is a finite set evaluated by the numerical solver. The policy function is then evaluated as:

$$\hat{\pi}(q_U, a_d) = \pi_{a_d}\left(\operatorname{argmax}_{v \in V_{a_d}} v^T q_U\right) \quad (9)$$

Therefore, the maximum complexity for one evaluation of the policy function is $\max_{a_d \in A^d} O(K(W+3)|\mathcal{V}_{a_d}|)$.

Figure 7:
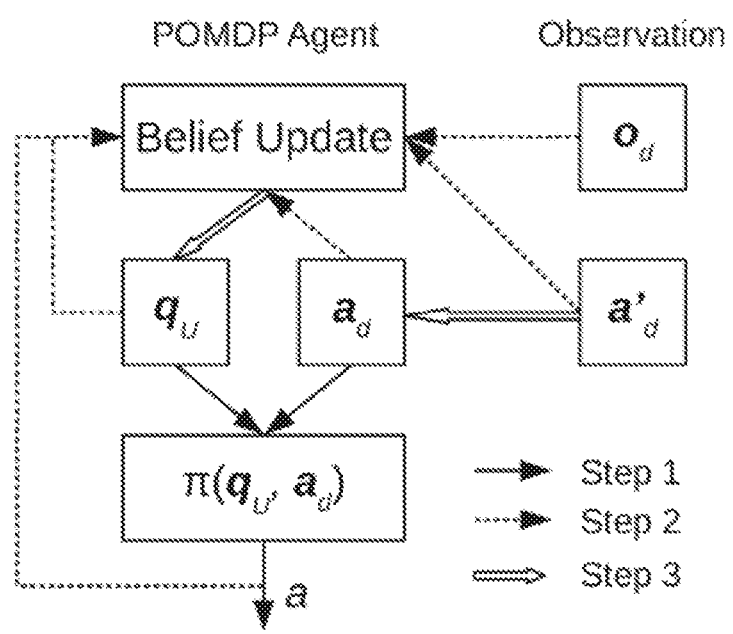
FIG. 7 illustrates a workflow of the trans-layer ROHC compressor based on a belief update process such as the one involved in the POMDP model.

Note that other trans-layer ROHC compressor design can be readily generalized without departing its embodiment from this embodiment by following the belief update framework in FIG. 7. Instead of solving the POMDP explicitly, it is possible to adopt other heuristic rules to determine the header type based on $q_U$ and $a_d$, for example, by thresholding the marginal probability distribution of the decompressor's state. These heuristic approaches can avoid the offline complexity to solve POMDP and still achieve comparable performances.

Header-Compression Technique

Figure 8:
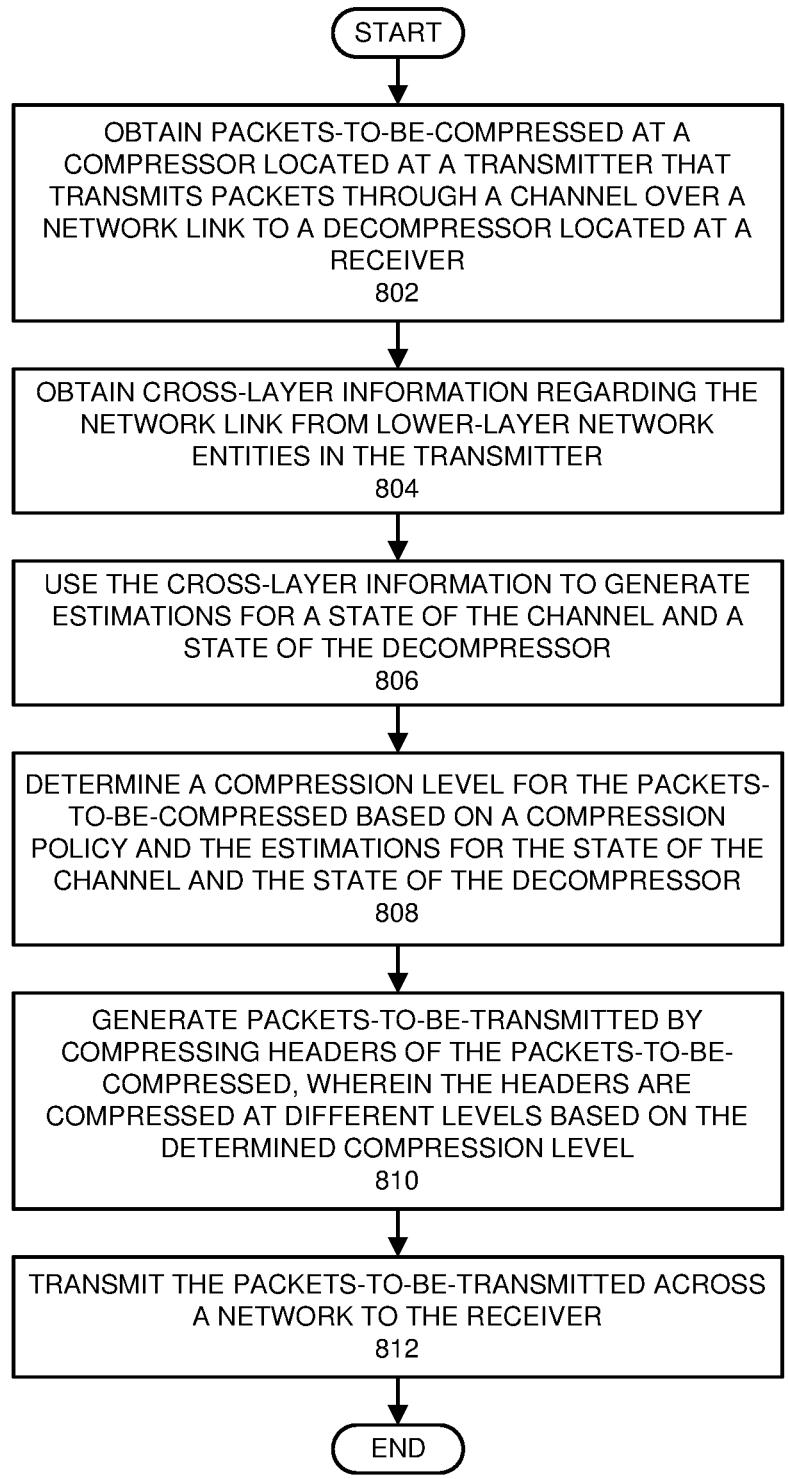
FIG. 8 presents a flow chart illustrating operations performed during the trans-layer ROHC technique in accordance with the disclosed embodiments.

FIG. 8 presents a flow chart illustrating operations performed during the trans-layer ROHC technique in accordance with the disclosed embodiments. First, the system obtains packets-to-be-compressed at a compressor located at a transmitter that transmits packets through a channel over a network link to a decompressor located at a receiver (step 802). The system also obtains cross-layer information regarding the network link from lower-layer network entities in the transmitter (step 804). Next, the system uses the cross-layer information to generate estimations for a state of the channel and a state of the decompressor (step 806). The system then determines a compression level for the packets-to-be-compressed based on a compression policy and the estimations for the state of the channel and the state of the decompressor (step 808). The system subsequently generates packets-to-be-transmitted by compressing headers of the packets-to-be-compressed, wherein the headers are compressed at different levels based on the determined compression level (step 810). Finally, the system transmits the packets-to-be-transmitted across a network to the receiver (step 812).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 9:
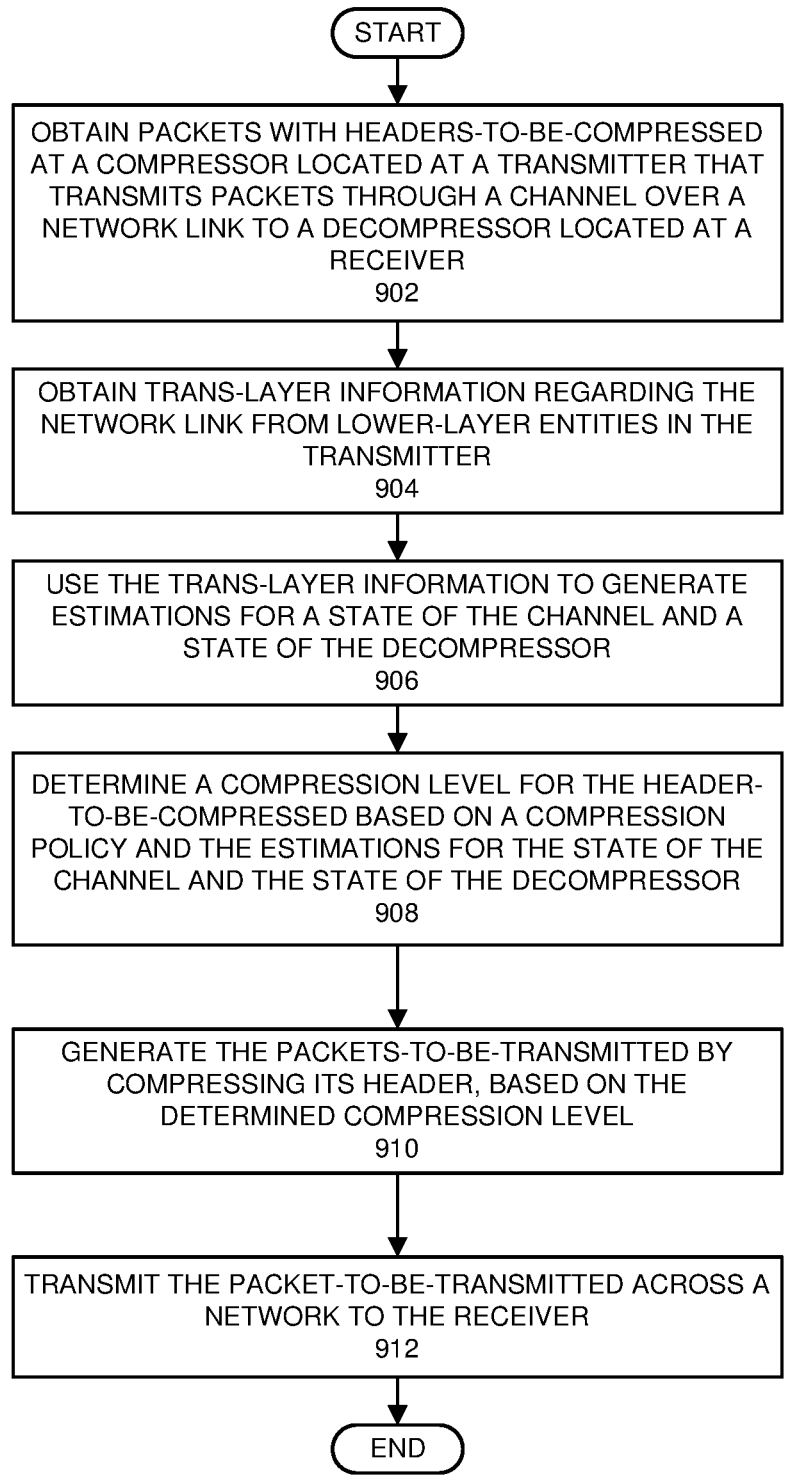
FIG. 9 presents a flowchart illustrating an ROHC technique using trans-layer information to improve the performance of a packet-header-compression operation within a wireless communication system in accordance with the disclosed embodiments.

FIG. 9 presents a flowchart illustrating an ROHC technique using trans-layer information to improve the performance of a packet-header-compression operation within a wireless communication system in accordance with the disclosed embodiments. During operation, the system obtains packets with headers-to-be-compressed at a compressor located at a transmitter that transmits packets through a channel over a network link to a decompressor located at a receiver (step 902). The system also obtains trans-layer information regarding the network link from lower-layer entities in the transmitter (step 904). Next, the system uses the trans-layer information to generate estimations for a state of the channel and a state of the decompressor (step 906). The system then determines a compression level for the header-to-be-compressed based on a compression policy and the estimations for the state of the channel and the state of the decompressor (step 908). The system subsequently generates the packets-to-be-transmitted by compressing its header, based on the determined compression level (step 910). Finally, the system transmits the packet-to-be-transmitted across a network to the receiver (step 912).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for compressing and transmitting packets over a wireless network, the method comprising:
   obtaining packets-to-be-compressed at a compressor located at a transmitter that transmits packets through a channel over a wireless network link to a decompressor located at a receiver, wherein the compressor is an analytical U-mode RObust Header Compression (ROHC) compressor based on a Markov model;
   obtaining cross-layer information regarding the wireless network link from lower-layer network entities in the transmitter and the receiver, wherein the lower-layer network entities operate in layers 1 and 2 of the Open Systems Interconnection (OSI) model;
   generating estimations for a state of the channel and a state of the decompressor based on at least the cross-layer information;
   optimizing the compressor for determining a timeout value to maximize a stationary efficiency of a header recovery;
   characterizing transient ROHC behavior via a slow-start mechanism;
   determining a compression level for the packets-to-be-compressed based on a compression policy and the estimations for the state of the channel and the state of the decompressor and the characterized transient ROHC behavior, wherein determining the compression level occurs without ROHC feedback;
   generating packets-to-be-transmitted by compressing headers of the packets-to-be-compressed, wherein the headers are compressed at different levels based on the determined compression level; and
   transmitting the packets-to-be-transmitted through a channel over the wireless network link to the receiver.

2. The method of claim 1, wherein determining the compression level involves using a dynamic process to select the compression level.

3. The method of claim 2, wherein determining the compression level involves using a belief update process on a state of the channel and a state of the decompressor.

4. The method of claim 2, wherein determining the compression level involves using a Partially Observable Markov Decision Process (POMDP) to select an optimal compression level based on a belief on a state of the channel and a state of the decompressor.

5. The method of claim 2, wherein determining the compression level involves using potentially inexact and delayed trans-layer information collected from the lower-layer network entities in real time.

6. The method of claim 1, wherein determining the compression level involves determining timer values for state transitions of the compressor based on information obtained from the lower-layer network entities.

7. The method of claim 1, wherein compressing the headers of the packets-to-be-compressed includes using a window-based least significant bit (W-LSB) technique to compress the headers.

8. The method of claim 1, wherein generating the estimations for the state of the channel and the state of the decompressor involves using a Markov model.

9. The method of claim 1, wherein the different levels of header compression include the following:
- no header compression;
- partial header compression; and
- full header compression.

10. The method of claim 1, wherein the cross-layer information comprises one or more of the following:
- a state-transition probability of the channel;
- estimations of packet error rates under different channel states;
- a channel state estimation;
- an error probability for the channel state estimation;
- a transmission-status estimation; and
- an error probability for transmission-status estimation.

11. The method of claim 10, wherein the cross-layer information is derived from one or more of the following:
- a physical-layer channel model;
- modulation and coding schemes;
- Automatic Repeat Request (ARQ) feedback;
- Hybrid ARQ (HARQ) feedback; and
- packet-segmentation and concatenation information.

12. The method of claim 1, wherein the lower-layer network entities comprise MAC/PHY layer entities in the transmitter.

13. A non-transitory, computer-readable storage medium storing instructions that when executed by a computer cause the computer to perform a method for compressing and transmitting packets over a wireless network, the method comprising:
- obtaining packets-to-be-compressed at a compressor located at a transmitter that transmits packets through a channel over a wireless network link to a decompressor located at a receiver, wherein the compressor is an analytical U-mode RObust Header Compression (ROHC) compressor based on a Markov model;
- obtaining cross-layer information regarding the wireless network link from lower-layer network entities in the transmitter and the receiver, wherein the lower-layer network entities operate in layers 1 and 2 of the Open Systems Interconnection (OSI) model;
- generating estimations for a state of the channel and a state of the decompressor based, in part, on the cross-layer information;
- optimizing the compressor for determining a timeout value to maximize a stationary efficiency of a header recovery;
- characterizing transient ROHC behavior via a slow-start mechanism;
- determining a compression level for the packets-to-be-compressed based on a compression policy and the estimations for the state of the channel and the state of the decompressor and the characterized transient ROHC behavior, wherein determining the compression level occurs without ROHC feedback;
- generating packets-to-be-transmitted by compressing headers of the packets-to-be-compressed, wherein the headers are compressed at different levels based on the determined compression level; and
- transmitting the packets-to-be-transmitted through a channel over the wireless network link to the receiver.

14. The non-transitory, computer-readable storage medium of claim 13, wherein determining the compression level involves using a dynamic process to select the compression level.

15. The non-transitory, computer-readable storage medium of claim 13, wherein determining the compression level involves using a belief update process on a state of the channel and a state of the decompressor.

16. The non-transitory, computer-readable storage medium of claim 14, wherein determining the compression level involves using a Partially Observable Markov Decision Process (POMDP) to select an optimal compression level.

17. The non-transitory, computer-readable storage medium of claim 14, wherein determining the compression level involves using potentially inexact and delayed trans-layer information collected from the lower-layer network entities in real time.

18. The non-transitory, computer-readable storage medium of claim 13, wherein determining the compression level involves determining timer values for state transitions of the compressor based on information obtained from the lower-layer network entities.

19. The non-transitory, computer-readable storage medium of claim 13, wherein compressing the headers of the packets-to-be-compressed includes using a window-based least significant bit (W-LSB) technique to compress the headers.

20. The non-transitory, computer-readable storage medium of claim 13, wherein generating the estimations for the state of the channel and the state of the decompressor involves using a Markov model.

21. The non-transitory, computer-readable storage medium of claim 13, wherein the different levels of header compression include the following:
- no header compression;
- partial header compression; and
- full header compression.

22. The non-transitory, computer-readable storage medium of claim 13, wherein the cross-layer information comprises one or more of the following:
- a state-transition probability of the channel;
- estimations of packet error rates under different channel states;
- a channel state estimation;
- an error probability for the channel state estimation;
- a transmission-status estimation; and
- an error probability for transmission-status estimation.

23. The non-transitory, computer-readable storage medium of claim 22, wherein the cross-layer information is derived from one or more of the following:
- a physical-layer channel model;
- modulation and coding schemes;
- Automatic Repeat Request (ARQ) feedback;
- Hybrid ARQ (HARM) feedback; and
- packet-segmentation and concatenation information.

24. The non-transitory, computer-readable storage medium of claim 13, wherein the lower-layer network entities comprise MAC/PHY layer entities in the transmitter.

25. A system that compresses and transmits packets over a wireless network, the system comprising:
   a transmitter that transmits packets through a channel over a wireless network link to a receiver, wherein the compressor is an analytical U-mode RObust Header Compression (ROHC) compressor based on a Markov model; and
   a compressor within the transmitter that compresses the packets prior to transmission;
   wherein during operation, the transmitter is designed to:
      obtain packets-to-be-compressed at the compressor located at the transmitter that transmits packets through the channel over the wireless network link to a decompressor located at the receiver;
      obtain cross-layer information regarding the wireless network link from lower-layer network entities in the transmitter and the receiver, wherein the lower-layer network entities operate in layers 1 and 2 of the Open Systems Interconnection (OSI) model;
      generate estimations for a state of the channel and a state of the decompressor by utilizing the cross-layer information;
      optimize the compressor for determining a timeout value to maximize a stationary efficiency of a header recovery;
      characterize transient ROHC behavior via a slow-start mechanism;
      determine a compression level for the packets-to-be-compressed based on a compression policy and the estimations for the state of the channel and the state of the decompressor and the characterized transient ROHC behavior, wherein determining the compression level occurs without ROHC feedback; and
      generate packets-to-be-transmitted by compressing headers of the packets-to-be-compressed, wherein the headers are compressed at different levels based on the determined compression level.

26. The system of claim 25, wherein while determining the compression level, the compressor uses a dynamic process to select the compression level.

27. The system of claim 25, wherein while determining the compression level, the compressor uses a belief update process on a state of the channel and a state of the decompressor.

28. The system of claim 26, wherein while determining the compression level, the compressor uses a Partially Observable Markov Decision Process (POMDP) to select an optimal compression level.

29. The system of claim 28, wherein determining the compression level involves using potentially inexact and delayed trans-layer information collected from the lower-layer network entities in real time.

30. The system of claim 25, wherein while determining the compression level, the compressor determines timer values for state transitions of the compressor based on information obtained from the lower-layer network entities.

31. The system of claim 25, wherein while compressing the headers of the packets-to-be-compressed, the compressor uses a window-based least significant bit (W-LSB) technique to compress the headers.

32. The system of claim 25, wherein while generating the estimations for the state of the channel and the state of the decompressor, the compressor uses a Markov model.

33. The system of claim 25, wherein the different levels of header compression include the following:
   no header compression;
   partial header compression; and
   full header compression.

34. The system of claim 25, wherein the cross-layer information comprises one or more of the following:
   a state-transition probability of the channel;
   estimations of packet error rates under different channel states;
   a channel state estimation;
   an error probability for the channel state estimation;
   a transmission-status estimation; and
   an error probability for transmission-status estimation.

35. The system of claim 34, wherein the cross-layer information is derived from one or more of the following:
   a physical-layer channel model;
   modulation and coding schemes;
   Automatic Repeat Request (ARQ) feedback;
   Hybrid ARQ (HARM) feedback; and
   packet-segmentation and concatenation information.

36. The system of claim 25, wherein the lower-layer network entities comprise MAC/PHY layer entities in the transmitter.

* * * * *